United States Patent
Hu et al.

[11] Patent Number: 5,092,036
[45] Date of Patent: Mar. 3, 1992

[54] ULTRA-TALL INDIUM OR ALLOY BUMP ARRAY FOR IR DETECTOR HYBRIDS AND MICRO-ELECTRONICS

[75] Inventors: William C. Hu; Ernest P. Longerich, both of Chatsworth; Saverio A. D'Agostino, Camarillo, all of Calif.

[73] Assignee: Hughes Aircraft Company, Los Angeles, Calif.

[21] Appl. No.: 614,051

[22] Filed: Nov. 9, 1990

Related U.S. Application Data

[62] Division of Ser. No. 373,972, Jun. 30, 1989, abandoned.

[51] Int. Cl.$^5$ ............................ H05K 3/30; H05K 3/34
[52] U.S. Cl. .................................... 29/854; 250/332; 250/338.1; 250/349; 357/68
[58] Field of Search ............... 357/68, 69; 250/330, 250/332, 349, 352, 338.4, 338.1, 370.15, 578.1; 29/854, 829

[56] References Cited

U.S. PATENT DOCUMENTS

| | | | |
|---|---|---|---|
| 4,067,104 | 1/1978 | Tracy | 29/854 |
| 4,072,863 | 2/1978 | Roundy | 250/332 |
| 4,197,469 | 4/1980 | Cheung | 377/53 |
| 4,354,109 | 10/1982 | Gelpey et al. | 250/349 |
| 4,467,340 | 8/1984 | Rode et al. | 357/24 |
| 4,670,653 | 6/1987 | McConkle et al. | 250/330 |
| 4,675,525 | 6/1987 | Amingual et al. | 250/338.1 |
| 4,703,559 | 11/1987 | Ehrfeld et al. | 29/854 |
| 4,740,700 | 4/1988 | Shaham et al. | 250/332 |
| 4,862,588 | 9/1989 | Mackay | 29/854 |

FOREIGN PATENT DOCUMENTS 1194188  9/1985  Canada ............................ 244/3.16

*Primary Examiner*—Constantine Hannaher
*Assistant Examiner*—Edward J. Glick
*Attorney, Agent, or Firm*—C. D. Brown; R. M. Heald; W. K. Denson-Low

[57] ABSTRACT

Method for improving particular interconnect pads for microcircuitry so that they provide more compliant interconnections between opposed pairs of contacts of the microchips in a hybrid detector array assembly. The individual tubes of prior art interconnect pads are filled with indium and are then etched away to leave indium columns of increased height, relative to the indium bumps that have heretofore been used in the contact connections of hybrid detector array assemblies. Other materials may be substituted for the indium and a number of variants of the process are also disclosed.

14 Claims, 3 Drawing Sheets

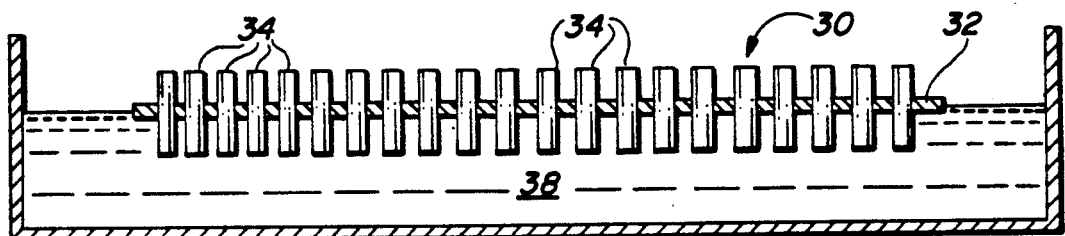
FIG-3
FIG-4
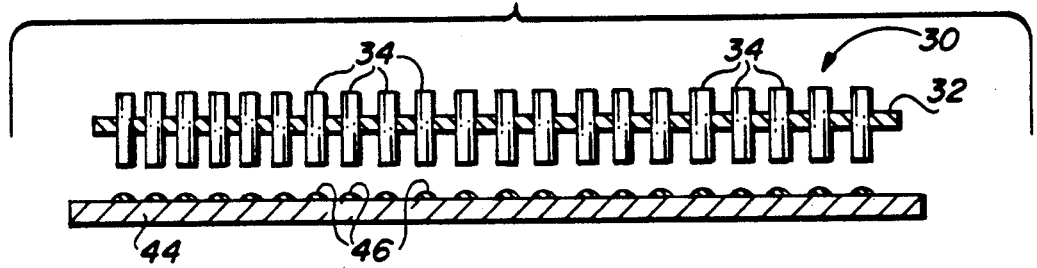
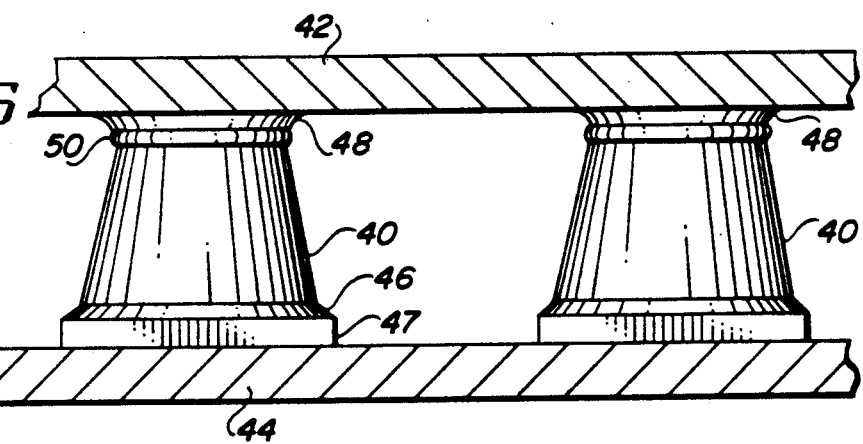
FIG-5
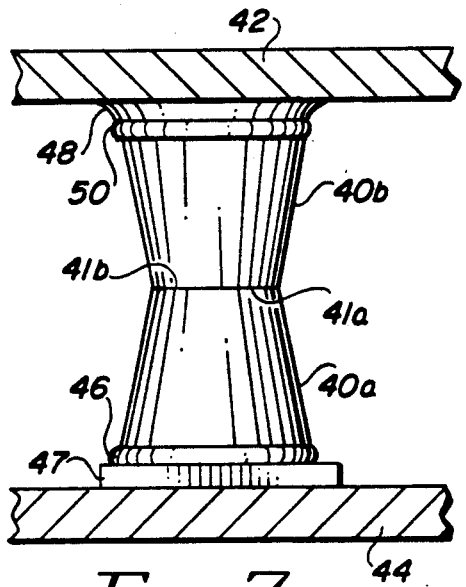
FIG-7
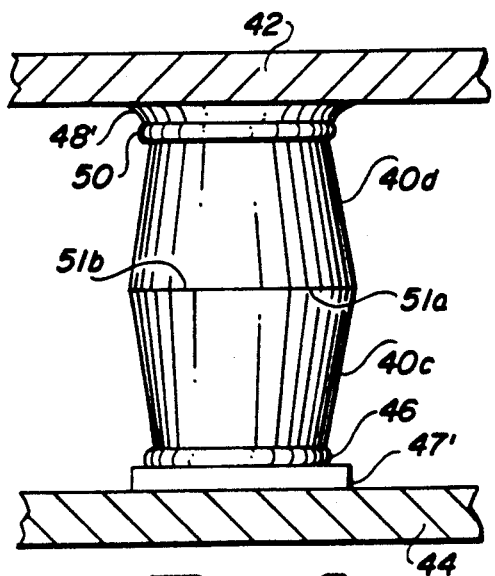
FIG-8

ULTRA-TALL INDIUM OR ALLOY BUMP ARRAY FOR IR DETECTOR HYBRIDS AND MICRO-ELECTRONICS

This is a division of application Ser. No. 07/373,213 filed June 30, 1989, now abandoned.

BACKGROUND OF THE INVENTION

1. Field of the Invention

This invention relates to electrical connectors for infrared detectors and, more particularly, to arrangements for improving the reliability of connections to a plurality of sensors in a detector array assembly which is subject to thermal fatigue from temperature cycling.

2. Description of the Related Art

In the present fabrication of focal plane arrays for infrared sensing systems, the hybrid detector array assembly comprises a pair of microchips, one bearing the array of sensors and the other bearing a corresponding array of cells or diodes with associated contact pads to provide the readout of individual sensor signals. The contact pairs of the two microchips are joined together in a process called hybridization. In this process, a plurality of indium bumps on the detector chip and a corresponding plurality of indium bumps on the readout chip are cold welded together by pressure. Once joined, they are no longer separable and the breaking of any weld constitutes a failure of that readout cell.

Over time an infrared detector array is repeatedly cycled between room temperature and its normal operating temperature of 77 degrees K. This repeated temperature cycling is responsible for problems relating to thermal fatigue which results from the different coefficients of thermal expansion in the different materials present in the hybrid detector assembly.

In the present (prior art) fabrication process, the indium bumps are made by vapor deposition through a photo-reduced mask pattern and have a typical height of 6–9 microns. It is not possible to deposit the indium bumps more than 10 microns high with acceptable quality and density. Over the temperature cycling range between room temperature and the 77 degree K. operating temperature, the various materials present in the array account for the thermal fatigue problems. For example, the readout chip is a silicon substrate with contact pads approximately 0.001 inch square on 0.002 inch spacing. A typical array may have 128×128 cells. The sensors are arranged in a similar array on a cadmium telluride substrate. Because of the differences in thermal expansion and contraction between the detector chip and readout chip, repeated temperature cycling results in various failure modes: contact pads are pulled away from the substrate, pieces of contacts break off, the cold-welded junctions of the indium bumps fracture and separate, the stresses induced by the differential thermal expansion or contraction of the substrates may cause warpage of the array chips, and the like. It is known that these problems could be minimized somewhat if the indium bumps, prior to being welded together, were made taller or longer so that they could still establish the desired circuit connections while increasing the spacing between the detector chip and the readout chip. The resulting more compliant arrangement is expected to exhibit more tolerance for the effects of thermal expansion and contraction during repeated temperature excursions between room temperature and operating temperature. However, no simple way of building up the indium bumps to increase their length has been proposed heretofore, to our knowledge.

SUMMARY OF THE INVENTION

In brief, arrangements in accordance with the present invention provide an array of elongate indium elements for insertion between the two microchips of a hybrid detector array assembly with electrical connections being established between these inserted elements and indium bumps on the respective mesa contacts and contact pads at opposite ends of the elements.

One particular arrangement in accordance with the present invention involves the adaptation of a known integrated circuit connector or interconnect pad to develop the ultra-tall indium bump array of this invention. This integrated circuit connector is marketed by Raychem Corporation, Menlo Park, Calif., under the trademark Uniax. It consists of a high performance polymer film as a carrier for an array of metal tubes which extend through the film and protrude from each side. Typical dimensions of the Uniax integrated circuit connector are: a film thickness of 75 microns, tube diameter of 40 microns, tube spacing of 80 microns, wall thickness of 10 microns and protrusion from the polymer film on each side of 20 microns. Such an interconnect pad can be fabricated by forming a sandwich or laminate of three layers of two different, differentially etchable materials. A laser is used to drill holes through the laminate using a mask pattern corresponding to the detector array, followed by through-hole plating with copper, nickel, or some other suitable material to form a plurality of miniature tubes. The top and bottom layers of the laminate are then removed by etching, leaving the middle polymer layer as a carrier film of the metal tubes.

The present invention provides the additional steps to make such an interconnect pad adaptable to use in a known focal plane array assembly, as follows:

1. Use the focal plane array mesa mask pattern to make a mask suitable to fabricate a matching Uniax array.

2. Use an interconnect pad of Uniax copper tubes which correspond to the focal plane array mask and specification therefor.

3. Clean and prepare the interconnect pad as for a soldering process.

4. Dip the pad in molten indium or other alloy. Continue the dip until the tubes are filled with the indium by capillary action.

5. Transfer the indium-filled tubes to the readout chip and affix them at one end to the individual contact pads on the readout chip by cold welding to indium bumps on the pads.

6. Etch out the original copper tubes with a suitable chemical etchant to release the carrier film.

7. Lift off the carrier film from the array of indium columns or, alternatively, remove the carrier film by reactive plasma etching and subsequently etch the copper tubes.

8. Place the detector chip in aligned position with the indium columns on the readout chip and cold weld the upper ends of the columns to indium bumps on the detector chip by pressure welding.

The ultra-tall indium or alloy columns fashioned in accordance with the invention and connected between the sensor contacts and the readout contact pads provide a compliant structural coupling between the detector and readout chips which enables the combination, i.e., the hybrid detector assembly to accommodate the effects of differential thermal expansion so that the deleterious results of thermal fatigue as described above—breaking off pieces of contacts, pulling contact pads away from the substrate, warpage, etc.—are avoided.

Variations of certain steps in the disclosed process are within the scope of the invention. For example, in place of the molten indium as a filler for the interconnecting tubes, a molten solder alloy may be used. This alloy will be a material which is suitable for attachment to the indium bumps by the hybridization process. Also, nickel capillary tubes may be used in place of the copper tubes. A suitable etchant for nickel would have to be used in the tube etching step.

In the preparation of completed focal plane arrays in accordance with the present invention, it is possible to conduct the quality control testing of the separate detector arrays prior to final assembly through the use of standard interconnect pads. Thus, the standard interconnect pads provide the necessary temporary interconnections between the detector and readout chips for the test evaluation. If the detector chip is found to be free of defects and suitable for use, the processing of the interconnect pads to form the ultra-tall indium columns and to attach the columns to the contact arrays of the respective detector and readout chips is completed, as described hereinabove.

In accordance with further aspects of the present invention, different forms of extended indium columns may be developed to serve different purposes. For example, separate indium columns may be attached respectively to the pads on the silicon substrate of the readout chip and to the contact mesas of the detector chip. The separate indium columns can then be connected at their adjacent ends to form a series of taller indium columns providing additional spacing between the detector and readout chips with correspondingly increased compliance to accommodate the thermal expansion and contraction. The individual connector tubes are generally tapered because of the way in which they are formed by a laser beam. If the smaller ends of the tubes are joined together in accordance with this aspect of the invention, the result is a configuration having a shape somewhat like that of an hourglass which exhibits improved flexibility and compliance under thermal expansion and contraction.

In another alternative, used to develop a smaller diameter indium column with smaller diameter ends for connection to the respective contact mesas and contact pads, the order of taper of the indium columns is reversed with the small ends being connected respectively to the contact mesas of the detector chip and contact pads of the readout chip, while the larger diameter ends of the two aligned indium columns are joined. By joining two individual indium columns in this fashion, the problem of making smaller masks and holes is alleviated.

In accordance with still another arrangement of the present invention, multi-layer plating is used to develop a higher aspect ratio for the indium columns. This process begins with electroless plated copper tubes which, prior to being filled with indium, are given a layer of electroless nickel plated on the inside of the tubes. Thereafter, the tubes are filled with indium and mounted on the substrate contact pads. The next step is as before: selective etching removes the copper layer and permits the polymer film carrier to be removed, after which the nickel is etched away. The result is a set of interconnecting indium-filled columns having the same height as before but reduced in diameter, thus providing an increased aspect ratio. Completion of the assembly then continues as previously described. The etchants which are employed are selected to be compatible with silicon microcircuitry.

BRIEF DESCRIPTION OF THE DRAWINGS

In the accompanying drawings:

FIG. 3 is a schematic representation of one particular step in the method of the present invention;

FIG. 4 is a schematic representation of another step in the method of the present invention;

FIG. 5 is a schematic representation showing particular details of a portion of a detector array assembly produced in accordance with the present invention;

FIG. 7 is a diagram, like that of FIG. 5 but showing a first alternative arrangement in accordance with the present invention;

FIG. 8 is a diagram like that of FIG. 5 but showing a second alternative arrangement in accordance with the present invention.

DESCRIPTION OF THE PREFERRED EMBODIMENT

Figure 1:
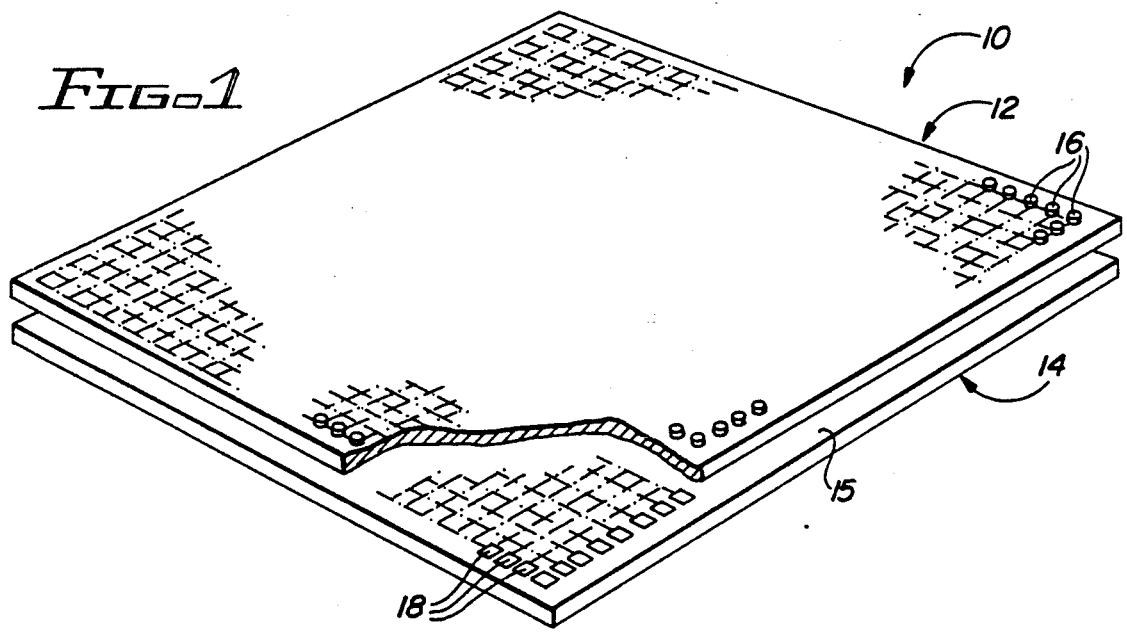
FIG. 1 is a schematic view, partially broken away, of a typical hybrid infrared detector assembly of the type to which the present invention is directed.

As indicated in the schematic representation of FIG. 1, a conventional hybrid infrared detector assembly 10, to which the present invention is directed, may comprise a detector array 12 generally aligned with a readout chip 14. The detector array 12 comprises a plurality of individual sensors 16, shown here in a square array, which may typically be a 128×128 array for a total of 16,384 individual sensors. The readout chip 14 is typically a silicon substrate 15 bearing a corresponding plurality of usually square pads 28, typically 0.001 inch square, with 0.002 inch center-to-center separations. These pads may be fashioned of multiple layers of various contact metals with gold plating applied as a thin coating layer. Typically, indium bumps (not shown) are located on the respective pads 18 and on the facing connections to the sensors 16 and the detector and readout chips 12, 14 are brought together such that the indium bumps on facing aligned contact elements are cold welded together by pressure. Once joined in this fashion, the bump connections are not separable in normal operation.

The chips 12 and 14 are of necessity constructed of different materials, e.g. cadmium telluride and silicon, which have different coefficients of thermal expansion. In use, the hybrid infrared detector 10 is regularly cycled over a temperature range of about 220 degrees C. (room temperature to operating temperature of 77 degrees K. and return). Because of the differences in the degree of expansion or contraction with temperature of the disparate materials in the two chips 12, 14, it will be appreciated that significant shear forces may develop at the various contacts which may result in breaking of the indium bump welds, fracture of contact metals or other contact connections, warping the substrates and the like.

Figure 2:
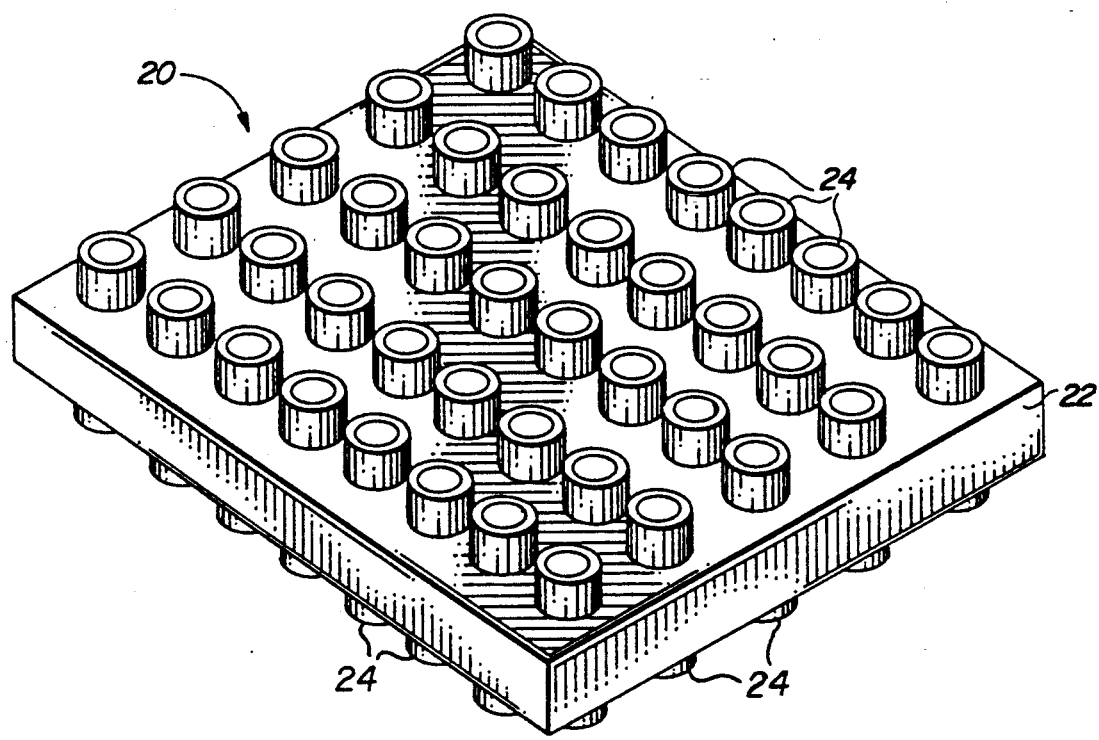
FIG. 2 is a schematic diagram representing an interconnect pad such as the Uniax connector array produced by Raychem Corporation.

FIG. 2 is a schematic representation of a particular interconnect pad 20 which may be used for providing interconnections between the sensors 16 and the pads 18 of the microchips 12, 14 of FIG. 1. The particular interconnect pad of FIG. 2 corresponds to the universal integrated connector which is marketed under the trademark Uniax of Raychem Corporation. It is shown as comprising a high performance polymer film 22 with protruding metal tubes 24 which extend through the film 22 that serves as a carrier. Although not apparent in FIG. 2, it will be understood that the tubes 24 are actually tapered because of the way in which they are made by the through-hole plating of holes which are formed by a laser beam. Such an interconnect pad can be fabricated by forming a sandwich or laminate of three layers of two different, differentially etchable materials. A laser is used to drill holes through the laminate via a photo-reduced mask in a pattern corresponding to the detector array, followed by through-hole plating with copper or some other suitable material to form a plurality of miniature tubes. The top and bottom layers of the laminate are then removed by etching, leaving the middle polymer layer as a carrier film of the metal tubes.

FIGS. 3 and 4 illustrate how interconnect pads similar to that represented in FIG. 2 are processed in accordance with the present invention. An interconnect pad 30 having a plurality of individual metal tubes 34 mounted in a carrier film 32 is partially immersed in a tank 36 of molter filler 38. The filler 38 may be indium or a suitable solder alloy. Molten indium has a low surface energy and readily wets the copper surfaces of the tubes 34, completely filling the tubes through the mechanism of capillary action.

After the tubes 34 are filled in this manner, the interconnect pad 30 is installed on a readout chip 44 (FIG. 4) which has a plurality of indium bumps 46 deposited on the respective contact pads 47. Pressure is applied to cold weld the indium filled tubes 34 to the indium bumps 46. Thereafter, an etching solution—e.g., ammonium sulphate/hydrogen peroxide for copper tubes—is applied to etch the copper away, thus freeing the polymer film carrier 32 for ready removal off the tops of the assembly of FIG. 4. This is followed by a subsequent step of attaching a detector chip 42 to the upper ends of the indium columns 40, completing the connections to the contact mesas 48, also provided with indium bumps 50. The resulting arrangement is represented schematically in FIG. 5.

Figure 6:
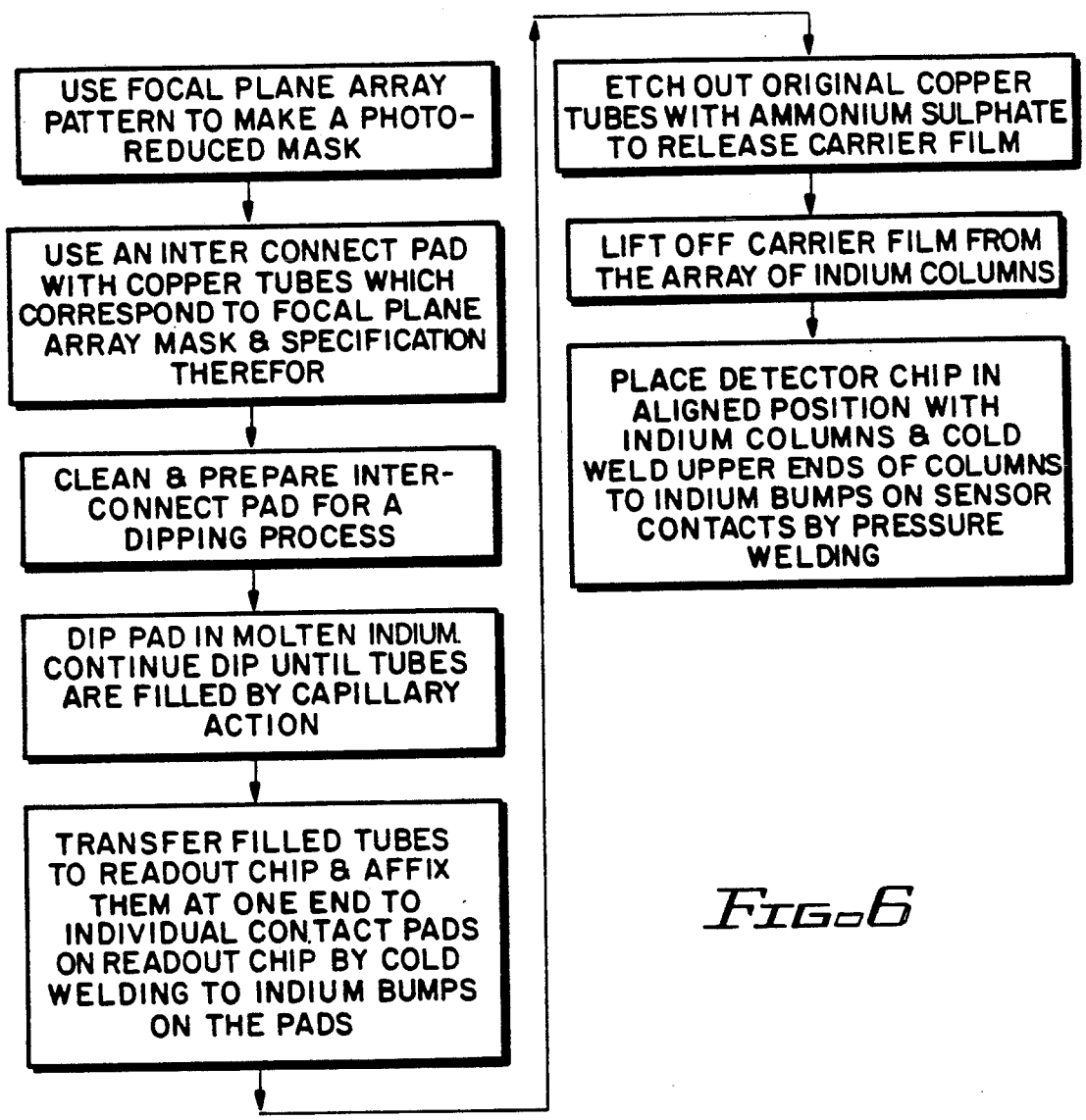
FIG. 6 is a flow chart showing particular steps in the method of the present invention.

The more detailed steps of the fabrication process of one embodiment of the present invention are represented in the block diagram of FIG. 6 and comprise the following:

1. Use the focal plane array pattern to make a photo-reduced mask.

2. Use an interconnect pad with copper tubes which correspond to the focal plane array mask and specification therefor.

3. Clean and prepare the interconnect pad as for a soldering process.

4. Dip the pad in molten indium. Continue the dip until the tubes are filled with indium by capillary action.

5. Transfer the indium-filled tubes to the readout chip and affix them at one end to the individual contact pads on the readout chip by cold welding to indium bumps on the pads.

6. Etch out the original copper tubes with ammonium sulphate to release the carrier film.

7. Lift off the carrier film from the array of indium columns.

8. Place the detector chip in aligned position with the indium columns and cold weld the upper ends of the columns to indium bumps on the sensor contacts by pressure welding.

FIG. 7 is a schematic representation of the variant of the arrangement of FIG. 5 which provides additional flexibility and compliance in the final detector array assembly by virtue of the increased height of the column and its hourglass shape, achieved by abutting two indium columns together, end-to-end. The structure depicted in FIG. 7 is essentially like that of FIG. 5 except that two indium columns 40a and 40b are shown joined at their smaller ends 41a and 41b in an hourglass configuration.

Another variant of the invention is represented schematically in FIG. 8, whereby a pair of indium columns 40c and 40d are joined in abutment at their larger ends 51a and 51b. This arrangement provides the benefit of adapting indium columns 40 of a particular size to a smaller diameter contact mesa 48' and smaller contact pad 47' on the microchips 42, 44. This avoids the necessity of developing a smaller mask and smaller laser holes for the fabrication of the interconnect pad in order to match the sizes of smaller contacts on the chips 42, 44. In addition, it achieves the advantage of the double height indium column, similar to the arrangement of FIG. 7.

Figure 9:
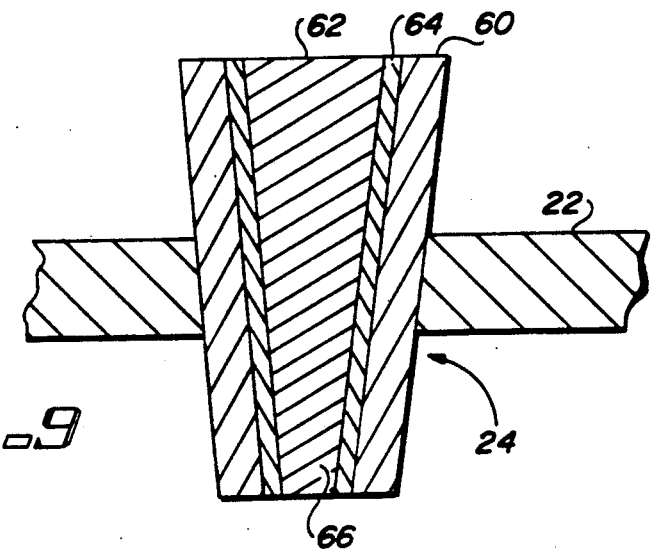
FIG. 9 is an illustration of still another arrangement of the invention.

FIG. 9 depicts the way in which an indium column may be formed from standard interconnect tubes to have an increased aspect ratio for the resulting column. In FIG. 9, the outer sectioned tapered cylinder 60 represents a copper tube such as 24 of FIG. 2 in the film carrier 22. The thickness of the cylinder 60 is typically 5 microns and the bore at the large end 62 is 15 microns. The inner surface of the tube 60 is plated with electroless nickel, forming a layer 64 of approximately 2 to 3 microns in thickness. Next, the copper layer 60 is removed by etching and the film 22 falls off the open column ends. Finally, the remaining nickel tube 64 is dipped in molten indium and becomes filled with indium 66. The nickel tube 64 is then removed by selected etching, leaving an indium column of the form 66. The result is a smaller diameter column than is realized by other methods, thus providing a column with an increased aspect ratio. The length of the column 66 is also increased by about 50 to 100% as compared with the columns such as 40 of FIG. 5 which are produced by other methods disclosed herein.

Arrangements in accordance with the present invention advantageously alleviate particular problems presently encountered in detector arrays operated at very cold temperatures which occur because of the effects of mismatch of the coefficients of thermal expansion of the different materials which are employed in the assembly. The present invention makes it possible to improve the reliability and operation of such apparatus over the multiple cool down cycles which the apparatus encounters during its operating lifetime, since the apparatus produced by the methods of the present invention is more compliant and flexible in the interconnecting columns between the respect contacts of the microchips and serves to reduce the shear forces which are encountered in the temperature cycling.

Although there have been shown and described hereinabove specific arrangements and methods for producing ultra-tall indium bump arrays in accordance with the invention for the purpose of illustrating the manner in which the invention may be used to advantage, it will be appreciated that the invention is not limited thereto. Accordingly, any and all modifications, variations, or equivalent arrangements which may occur to those skilled in the art should be considered to be within the scope of the invention as defined in the annexed claims.

What is claimed is:

1. A method of forming an array of connector columns for use as microcircuit connectors in a hybrid detector array assembly comprising the steps of:
   providing an interconnect pad having a plurality of hollow metal tubes mounted in a film carrier, said tubes being positioned in an array corresponding to the respective arrays of a plurality of sensor contacts and a plurality of readout contacts which are to be interconnected within said hybrid detector array assembly;
   dipping the ends of said tubes into a selected molten filler metal and allowing the molten filler metal to fill the tubes by capillary action;
   cooling said interconnect pad and solidifying the filler metal thereby forming an array of metal filled tubes;
   etching away said metal tubes and removing the film carrier thereby forming an array of filler metal columns; and
   connecting said filler metal columns between opposed pairs of said sensor contacts and said readout contacts of a plurality of respective detector and readout chips for completing said hybrid detector array assembly.

2. The method of claim 1 further including the step of providing each individual sensor contact and readout contact of said detector and readout chips with an indium bump for facilitating connection to a corresponding filler metal column.

3. The method of claim 2 wherein said metal filled tubes of said interconnect pad are mounted to said indium bumps of the contacts of said readout chip prior to the step of etching away said metal tubes.

4. The method of claim 1 wherein said selected molten filler metal is indium.

5. The method of claim 1 wherein said hollow metal tubes are formed of copper.

6. The method of claim 1 wherein an etching solution comprising ammonium sulphate is utilized during the step of etching away said metal tubes.

7. The method of claim 5 further including the step of applying a layer of electroless nickel to the inner surface of said copper tubes prior to dipping the ends of said tubes into said molten filler metal.

8. The method of claim 1 wherein said hollow metal tubes are formed of nickel.

9. The method of claim 1 further including the steps of cleaning and preparing said interconnect pad prior to dipping the ends of said tubes into said molter filler metal.

10. The method of claim 1 further including the step of making a photo-reduced mask from a selected detector array pattern and wherein said step of providing said interconnect pad includes using a pad having a hollow metal tube array which corresponds to said photo-reduced mask.

11. The method of claim 4 further including the steps of forming two sets of indium columns wherein said indium columns are tapered, connecting each set of tapered indium columns to said sensor contacts and said readout contacts of a corresponding one of said detector and readout chips to be interconnected, and joining the free ends of said indium columns for forming a double height column spacing between said detector and readout chips.

12. The method of claim 11 wherein the smaller ends of said columns of said respective sets of indium columns are connected together for developing unitary columns with an hour glass shape.

13. The method of claim 11 wherein the smaller diameter ends of said columns of the respective sets of indium columns are connected to the associated sensor and readout contacts of said detector and readout chips for permitting such connections to smaller dimension contacts than is possible when using only a single set of indium columns.

14. A method of fabricating a focal plane array assembly corresponding to a predetermined pattern, said assembly comprising a focal plane array including a plurality of indium column interconnections between a plurality of opposed pairs of sensor and readout contacts of a respective detector microchip and readout microchip of the focal plane array, said method comprising the steps of:
   using said focal plane array assembly pattern for making a photo-reduced mask;
   using an interconnect pad with copper tubes which corresponds to said focal plane array mask and specification therefor;
   cleaning and preparing said interconnect pad for a dipping process;
   dipping said interconnect pad in molten indium and continuing said dipping until said copper tubes are filled with indium by capillary action;
   transferring said indium-filled tubes to said readout microchip and affixing one end of said tubes to the individual readout contact pads on said readout microchip by cold welding to indium bumps mounted on said readout contact pads;
   etching away the original copper tubes with ammonium sulphate for releasing said carrier film;
   lifting off said carrier film from a formed array of indium columns for permitting said indium columns to be connected to said detector microchip; and
   placing said detector microchip in aligned position with said indium columns and cold welding the upper ends of said indium columns to indium bumps mounted on said sensor contacts by pressure welding.

* * * * *